United States Patent
Schoofs et al.

(10) Patent No.: US 11,253,925 B2
(45) Date of Patent: Feb. 22, 2022

(54) DIAMOND TOOL PIECE

(71) Applicant: ELEMENT SIX (UK) LIMITED, Didcot (GB)

(72) Inventors: Frank Schoofs, Didcot (GB); Jacqueline Hall, Didcot (GB); Richard Bodkin, Didcot (GB)

(73) Assignee: Element Six (UK) Limited, Didcot (GB)

( * ) Notice: Subject to any disclaimer, the term of this patent is extended or adjusted under 35 U.S.C. 154(b) by 680 days.

(21) Appl. No.: 16/090,935

(22) PCT Filed: May 16, 2017

(86) PCT No.: PCT/EP2017/061722
§ 371 (c)(1),
(2) Date: Oct. 3, 2018

(87) PCT Pub. No.: WO2017/198662
PCT Pub. Date: Nov. 23, 2017

(65) Prior Publication Data
US 2019/0118150 A1   Apr. 25, 2019

(30) Foreign Application Priority Data
May 17, 2016 (GB) .................................. 1608669

(51) Int. Cl.
*B23B 27/14* (2006.01)
*C30B 29/04* (2006.01)
(Continued)

(52) U.S. Cl.
CPC ............ *B23B 27/148* (2013.01); *B01J 3/065* (2013.01); *C01B 32/28* (2017.08); *C04B 35/52* (2013.01);
(Continued)

(58) Field of Classification Search
CPC ........... C09K 3/14; C30B 33/04; C30B 33/02; C01B 32/28
See application file for complete search history.

(56) References Cited

U.S. PATENT DOCUMENTS

| | | | |
|---|---|---|---|
| 4,012,300 A | 3/1977 | Caveney | |
| 4,184,079 A | 1/1980 | Hudson et al. | |

(Continued)

FOREIGN PATENT DOCUMENTS

| | | |
|---|---|---|
| EP | 0346794 A1 | 12/1989 |
| EP | 3170926 A1 | 5/2017 |

(Continued)

OTHER PUBLICATIONS

Davies, Gordon, "Current problems in diamond: towards quantitative understanding," Physica B, 1999, pp. 15-23, vol. 273-274, Elsevier Science B.V.

(Continued)

*Primary Examiner* — Pegah Parvini
(74) *Attorney, Agent, or Firm* — Kilpatrick Townsend & Stockton LLP

(57) ABSTRACT

A high-pressure high-temperature, HPHT, diamond tool piece and a method of producing an HPHT diamond tool piece. At least a portion of the HPHT diamond tool piece comprises an aggregated nitrogen centre to C-nitrogen centre ratio of greater than 30%. The method includes irradiating an HPHT diamond material to introduce vacancies in the diamond crystal lattice, annealing the HPHT diamond material such that at least a portion of the HPHT diamond material comprises an aggregated nitrogen centre to C-nitrogen centre ratio of greater than 30%, and processing the HPHT diamond material to form an HPHT diamond tool piece.

18 Claims, 2 Drawing Sheets

(51) Int. Cl.
*C30B 33/04* (2006.01)
*B01J 3/06* (2006.01)
*C01B 32/28* (2017.01)
*C04B 35/52* (2006.01)
*C30B 33/02* (2006.01)

(52) U.S. Cl.
CPC .............. *C30B 29/04* (2013.01); *C30B 33/02* (2013.01); *C30B 33/04* (2013.01); *B01J 2203/062* (2013.01); *B01J 2203/069* (2013.01); *B01J 2203/0655* (2013.01); *B01J 2203/0695* (2013.01); *B23B 2226/31* (2013.01); *B23B 2226/315* (2013.01); *C01P 2002/54* (2013.01); *C04B 2235/427* (2013.01)

(56) References Cited

U.S. PATENT DOCUMENTS

| | | | |
|---|---|---|---|
| 6,377,340 B1 * | 4/2002 | Anthony | G01N 21/64 |
| | | | 250/330 |
| 2007/0053823 A1 * | 3/2007 | Vins | B01J 3/062 |
| | | | 423/446 |
| 2013/0205681 A1 * | 8/2013 | Twitchen | C09K 3/1409 |
| | | | 51/307 |

FOREIGN PATENT DOCUMENTS

| | | |
|---|---|---|
| GB | 1578987 A | 11/1980 |
| GB | 1588418 A | 4/1981 |
| GB | 1588445 A | 4/1981 |
| GB | 2492822 A | 1/2013 |
| JP | 2014531967 A | 12/2014 |
| WO | 0179583 A2 | 10/2001 |
| WO | 2008007336 A2 | 1/2008 |
| WO | 2011151414 A2 | 12/2011 |
| WO | 2013028821 A1 | 2/2013 |
| WO | 2016010028 A1 | 1/2016 |

OTHER PUBLICATIONS

International Patent Application No. PCT/EP2017/061722, International Search Report and Written Opinion dated Aug. 1, 2017, 13 pages.

\* cited by examiner

| IaA | IaB | Ib |
| A Centre | B centre | C centre |

DIAMOND TOOL PIECE

TECHNICAL

The present invention relates to diamond tool pieces and methods of making synthetic diamond tool pieces.

BACKGROUND OF THE INVENTION

For any application a user must consider a number of factors when choosing a tool material. Such factors including: cost; toughness; wear rate/hardness; ability to process a desired working surface such as a cutting edge; useful lifetime; and inertness to chemical effects with the material to be processed.

An ideal tool material is one which is both hard and tough. These two properties of materials used in wear and tear applications are often presented on two perpendicular axes. Very simply, wear is a measurement of the amount of material removed per unit of operation. Toughness is a measure of a material's resistance to crack propagation.

There is a desire to provide materials which are harder, tougher, stronger and more wear resistant. There is also an on going desire to provide faster, more precise and cleaner production methods which add up to cost efficiency and improved performance. It is an aim of certain embodiments of the present invention to at least partially address some of these needs.

Diamond materials are the materials of choice for many premium performance cutting, drilling, grinding and polishing tools. Diamond materials are used in tooling solutions across a range of industries including a variety of metal, stone and woodworking industries. Examples include aerospace and automotive manufacturing, furniture production, stone quarrying, construction, mining and tunnelling, mineral processing, and the oil and gas industries.

The hardness properties of diamond make it a particularly suitable material in terms of wear resistance. However, diamond's limited ability to plastically deform under stress at the tool's working temperature leads to more rapid crack propagation in comparison to tougher materials such as steel.

Previous attempts to improve the durability of diamond have involved either adapting the method of forming the diamond material or treating the diamond material after forming the material. For example, WO 01/79583 teaches a process for improving the durability of a diamond-type tool to increase the impact strength and fracture toughness. The process involves implanting ions into the surface of a diamond-type tool. Ion implantation is a materials engineering process by which ions of a material can be implanted into another solid, thereby changing the physical properties of the solid. Under typical circumstances ions are implanted to a depth in the range 10 nanometers to 1 micrometer. WO 01/79583 teaches ion implantation which penetrates a diamond surface to a depth in the range 0.02 μm to 0.2 μm. Preferred ions include chromium, nickel, ruthenium, tantalum, titanium and yttrium.

U.S. Pat. No. 4,184,079 and GB1588445 also teach a method for toughening diamond by bombarding the diamond with ions of sufficient energy to penetrate the diamond surface. Various ions are suggested including carbon, nitrogen and hydrogen ions. It is described that the ions form a dislocation network in the diamond crystal lattice thereby inhibiting microcleavage of the diamond. It is further described that the dislocations can be confined to a depth of from 10 nm to 1 μm below the surface of the diamond crystals in order to a hard skin on the surface thereof. It is taught that the dose of ions should be produce quite small, in the range $10^{16}$ to $10^{18}$ ions $cm^{-2}$, and have energies in the range 10 keV to 10 MeV, more preferably less than 100 keV so that the species implanted by the bombardment do not have a detrimental effect on the diamond material. As ion bombardment of diamond results in the amorphisation and softening of the surface unless the temperature is held sufficiently high to maintain the crystal structure, it is taught to use a temperature of at least 500° C. during ion bombardment.

GB1588418 discloses a process for improving the wear characteristics of industrial diamonds. The process comprises implanting ions into the surface of the diamond. Carbon and nitrogen ions are suggested for this purpose.

U.S. Pat. No. 4,012,300 discloses a method of altering the friability of abrasive particles, particularly diamond and cubic boron nitride particles, by subjecting the particles to irradiation. Proton, neutrons and gamma radiation are suggested with neutrons being preferred.

It is an aim of certain embodiments of the present invention to improve the toughness and/or wear resistance of diamond tools. It is a further aim of certain embodiments of the present invention to avoid some of the problems associated with the aforementioned methods.

SUMMARY OF INVENTION

It is an object to provide an HPHT diamond tool piece with improved mechanical properties.

According to a first aspect, there is provided a high-pressure high-temperature, HPHT, diamond tool piece, wherein at least a portion of the HPHT diamond tool piece comprises an aggregated nitrogen centre to C-nitrogen centre ratio of greater than 30%. It has been found that such a tool piece has an improved wear resistance and chipping resistance compared to a similar tool piece that does not have an aggregated nitrogen centre to C-nitrogen centre ratio of greater than 30%.

As an option, the aggregated nitrogen centres comprise any of A centres and B centres.

The portion is optionally at least 40% of the volume of the HPHT diamond tool piece, and may be substantially the entire volume of the tool piece.

As an option, the HPHT diamond tool piece is a single crystal HPHT diamond tool piece. Alternatively, the HPHT diamond tool piece may comprise polycrystalline diamond, PCD. In this case, the PCD optionally contains a binder material.

As an option, the portion of the HPHT diamond tool piece comprises a nitrogen content selected from any of greater than 300 parts per million, greater than 350 parts per million and greater than 400 parts per million.

As a further option, the portion of the HPHT diamond tool piece comprises a nitrogen content selected from any of no greater than 800 parts per million; and no greater than 600 parts per million.

The aggregated nitrogen centre to C-nitrogen centre ratio is optionally greater than 40%. As a further option, the aggregated nitrogen centre to C-nitrogen centre ratio is greater than 50%.

The HPHT diamond tool piece is optionally selected from one of: a wear part, a dresser, a wire drawing die, a gauge stone, a cutter and an engraving tool.

According to a second aspect, there is provided a tool comprising at least one HPHT diamond tool piece as described above in the first aspect.

According to a third aspect, there is provided a method of producing a HPHT diamond tool piece. HPHT diamond material is irradiated to introduce vacancies in the diamond crystal lattice. The HPHT diamond material is then annealed such that at least a portion of the HPHT diamond material comprises an aggregated nitrogen centre to C-nitrogen centre ratio of greater than 30%. The HPHT diamond material is then processed to form an HPHT diamond tool piece.

As an option, the annealing is performed in an inert environment at a temperature of at least 800° C.

As an alternative option, the annealing is performed using a high-pressure high temperature process at a temperature of at least 1300° C. and a pressure of at least 4.5 GPa.

Note that irradiating may be performed before, during, or after the processing, but the annealing must be performed after the irradiation step.

As an option, the irradiating comprises irradiating the diamond material to a depth selected from any of: 1 μm or greater; 10 μm or greater; 100 μm or greater; 500 μm or greater; 1 mm or greater; and throughout a total thickness of the diamond material.

The irradiating is optionally performed at a temperature of: 500° C. or less; 400° C. or less; 300° C. or less; 200° C. or less; 100° C. or less; or 50° C. or less.

The method optionally further comprises cooling the diamond material during the irradiating.

The irradiating step optionally comprises using irradiation having an energy selected from any of 30 keV or greater; 0.1 MeV to 12 MeV; 0.5 MeV to 10 MeV; and 1 MeV to 8 MeV.

The irradiating step optionally comprises using electron irradiation having a dose rate selected from any of $1\times10^{15}$ e$^-$/cm$^2$ or greater; $1\times10^{16}$ e$^-$/cm$^2$ to $1\times10^{19}$ e$^-$/cm$^2$; $1\times10^{17}$ e$^-$/cm$^2$ to $1\times10^{19}$ e$^-$/cm$^2$; and $2\times10^{17}$ e$^-$/cm$^2$ to $1\times10^{19}$ e$^-$/cm$^2$.

The processing step optionally comprises shaping the HPHT diamond material to form a working surface.

As an option, the processing step comprises forming any of a wear part, a dresser, a wire drawing die, a gauge stone, a cutter and an engraving tool.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
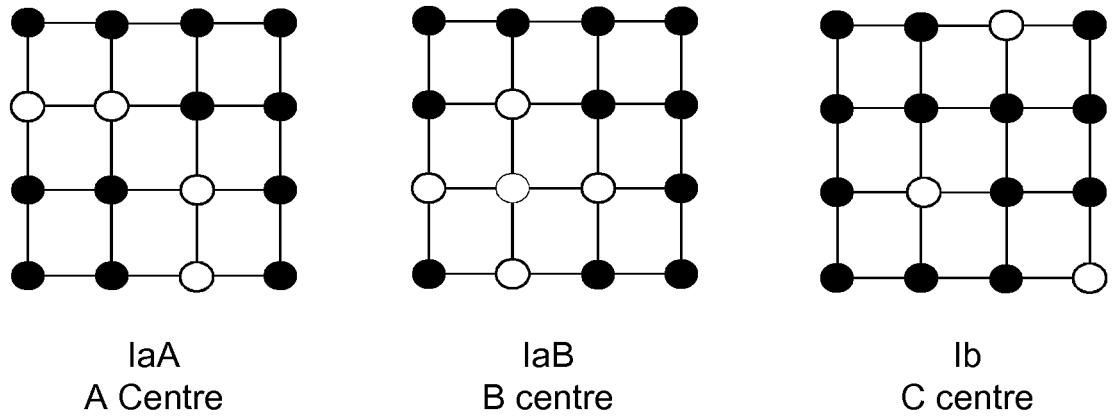
FIG. 1 illustrates schematically nitrogen substation in a diamond crystal lattice.

The following description refers to substitutional nitrogen in the crystal lattice of diamond. This type of diamond is commonly termed type 1 diamond, and the nitrogen typically occupies positions in the crystal lattice in one of three main configurations. Nitrogen can form A centres, B centres or C centres. These types of nitrogen substitution are illustrated in FIG. 1, which shows a diamond crystal lattice in two dimensions for clarity. Carbon atoms are denoted by black circles and nitrogen atoms are denoted by white circles.

An 'A' centre consists of a neutral nearest-neighbour pair of nitrogen atoms substituting for the carbon atoms. Diamond containing nitrogen predominantly in the A form is classed as Type IaA. FIG. 1 shows a lattice with two A centres.

A 'B' centre is a carbon vacancy surrounded by four nitrogen atoms substituting for carbon atoms. Diamond containing nitrogen predominantly in the B form is classed as Type IaB.

A 'C' centre is a single substitutional nitrogen atom in the crystal lattice that has no ordered relationship to another substitutional nitrogen atom. Diamond containing nitrogen predominantly in the C form is classed as Type Ib.

Type Ia diamonds can be colourless, brown, pink, and violet. Natural Type Ib diamonds can be deep yellow ("canary"), orange, brown or greenish. Type IIa and Type IIb diamond contain negligible nitrogen; some nitrogen is always present but in Type II diamond the levels are much lower than in Type I diamond. Type IIa and Type IIb diamond differ in that Type IIb diamond contains boron as an impurity. Type II diamonds vary from colourless to deep blue, pink or brown. The colour of a diamond is determined by the number, type and distribution of defects within the crystal structure. Colour can also be introduced if there is a fine dispersion of metallic particles in the diamond material. Crystal defects include dislocations, microcracks, twin boundaries, point defects, and low angle boundaries. As such, for example, the colour of diamond will depend on the type and distribution of impurities such as nitrogen and boron as well as the type and distribution of other defects such as dislocations. There are a large number of different types and subclasses of defects within diamond. For example, there are numerous different types of nitrogen defect alone, each having its own spectral characteristics.

The term 'aggregated nitrogen centre' is used herein to denote all types of nitrogen centre other than C centres. These are predominantly A and B centres, but the skilled person will appreciate that there are other types of centre where a nitrogen atom is located in the crystal lattice adjacent to another nitrogen atom or a vacancy or a combination of any number of these.

Figure 2:
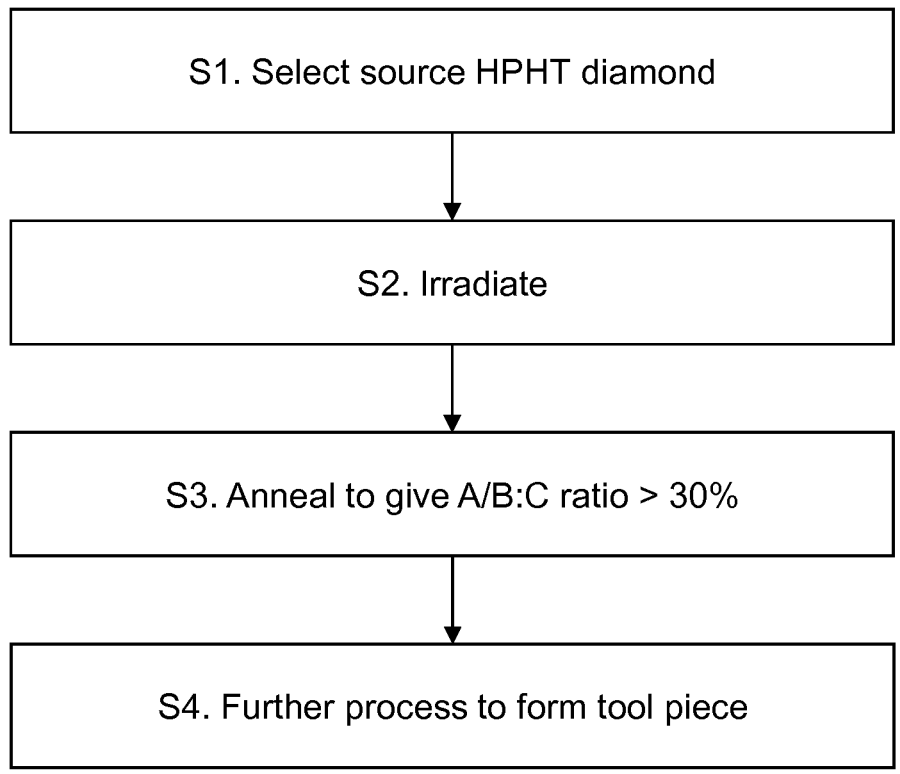
FIG. 2 is a flow diagram showing exemplary steps.

FIG. 2 shows the basic steps involved in performing a method according to an embodiment of the present invention. The following numbering corresponds to that of FIG. 2:

S1. A source High-Pressure High Temperature (HPHT) diamond material 10 is selected. This may be, for example, a single crystal HPHT diamond or polycrystalline diamond (PCD). PCD may contain a material such as cobalt located between diamond grains, or may be free of such a material. The HPHT diamond material 10 may be high nitrogen HPHT diamond material. This can be prepared by, for example, doping the diamond synthesis source material with a transition metal nitride compound (such as iron nitride) or an organic nitrogen containing compound.

S2. The diamond material 10 is irradiated with electrons (or another source, such as neutrons) to form an irradiated diamond material 12 with increased toughness and/or wear resistance. Irradiation may be formed at an elevated temperature, in one example between 50° C. and 500° C. The diamond material may be cooled during the irradiation process. In different embodiments, the irradiating has an energy selected from 30 keV or greater; 0.1 MeV to 12 MeV; 0.5 MeV to 10 MeV; and 1 MeV to 8 MeV. A preferred energy is 4.5 MeV. In different embodiments, a dose rate is selected from any of $1\times10^{15}$ e$^-$/cm$^2$ or greater; $1\times10^{16}$ e$^-$/cm$^2$ to $1\times10^{19}$ e$^-$/cm$^2$; $1\times10^{17}$ e$^-$/cm$^2$ to $1\times10^{19}$ e$^-$/cm$^2$;

and $2\times10^{17}$ e$^-$/cm$^2$ to $1\times10^{19}$ e$^-$/cm$^2$. Note that irradiation may be performed to any suitable depth up to and including the entire thickness of the diamond material 10.

S3. The irradiated diamond material 12 is then annealed to form an annealed diamond material 14 in which the aggregated nitrogen centre to C-nitrogen centre ratio is greater than 30%. Annealing may take place at an elevated temperature of at least 800° C. in a vacuum of better than $10^{-4}$ mbar or in a gas that is inert with respect to diamond at the annealing temperature, such as argon or nitrogen. An alternative annealing process is to use an HPHT process at a pressure of at least 4.5 GPa and a temperature of at least 1300° C.

S4. The annealed diamond material 14 is then processed to form a diamond tool piece 16. Processing may be, for example, cutting to a shape using a laser or mechanical cutter. The diamond tool piece 16 may be brazed to a carrier to form a diamond tool. Examples of tools that have diamond tool pieces include wear parts, dressers, wire drawing dies, gauge stones; cutters and engraving tools.

Figure 3:
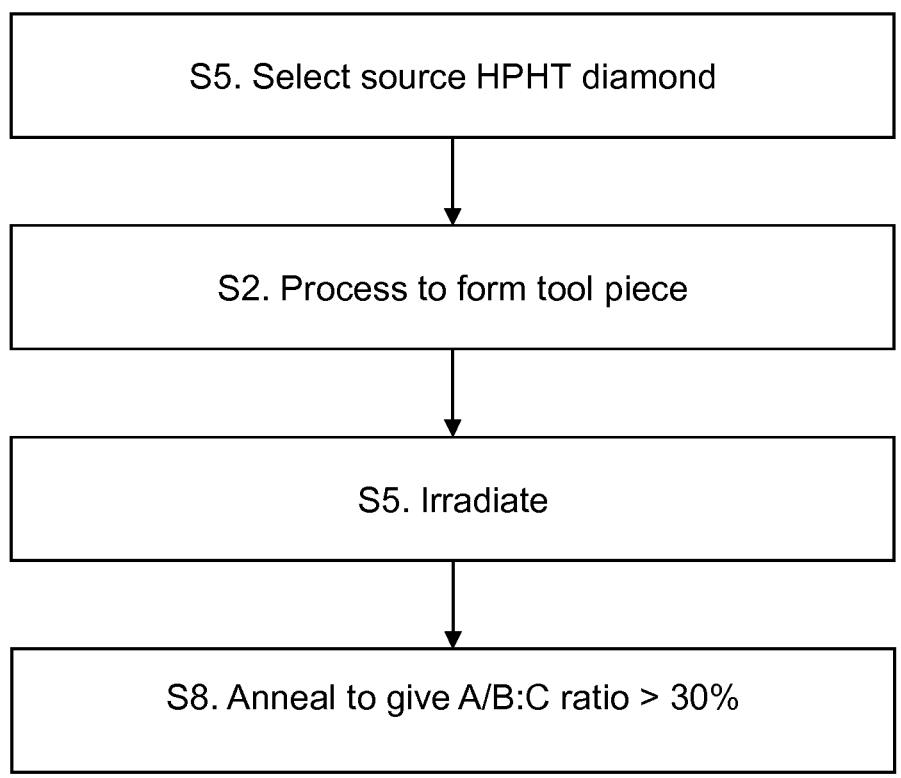
FIG. 3 is a flow diagram showing alternative exemplary steps.

Note that steps S2, S3 and S4 can be carried out in any suitable order, and may be repeated. For example, the processing of step S4 could be carried out before the irradiation of S2 and the annealing of S3, or could be carried out between the irradiation step of S2 and the annealing step of S3. Similarly, more than one irradiation step S2 or annealing step S3 may be used in order to apply different treatments such as radiation energy or dose, and for different amounts of time. The skilled person will appreciate that the steps may be performed in any suitable order, but by way of example, FIG. 3 shows an alternative order, with the following numbering corresponding to that of FIG. 3.

S5. A source HPHT diamond material 10 is selected.

S6. The source HPHT diamond material is processed to form a diamond tool piece.

S7. The diamond tool piece is irradiated.

S8. The irradiated diamond tool piece is annealed.

Electron irradiation (for example, less than or equal to 12 MeV) typically introduces vacancies in an isolated form. These may be in the neutral (V$^0$) and negative charge states (V$^-$). The total vacancy concentration ([V$_T$]=[V$^0$]+[V$^-$]) post irradiation should preferably be in the range: $1\times10^{14}$ to $1\times10^{22}$ vacancies/cm$^{-3}$; $1\times10^{15}$ to $1\times10^{21}$ vacancies/cm$^{-3}$; $5\times10^{15}$ to $1\times10^{20}$ vacancies/cm$^{-3}$; $1\times10^{16}$ to $5\times10^{19}$ vacancies/cm$^{-3}$; or $5\times10^{16}$ to $1\times10^{19}$ vacancies/cm$^{-3}$. An iterative process can be used to find optimum defect levels. A diamond material can be irradiated, tested, re-irradiated, and so on to find the optimum defect levels for a particular diamond material for a particular type of tool piece and tool application.

Electron irradiation is typically carried out with a beam source in the energy range 0.1 MeV to 12 MeV. The preferred energy is that which introduces a near uniform concentration of vacancies in a nitrogen doped diamond, while minimizing the formation of cascade damage e.g. vacancy chains. It has been found that 4.5 MeV provides a good compromise between these two factors.

Factors such as diamond temperature, beam energy, beam flux, and the starting diamond's properties can affect the [V$_T$] produced for a fixed experimental irradiation set-up and time. Irradiation is typically carried out with the sample mounted under ambient conditions ~300 K with only minimal temperature rise during the irradiation dose (e.g. less than 100 K). However, factors such as beam energy and beam flux can lead to sample heating. Preferably the sample is held as cold as possible (with even cryogenic cooling at 77 K being advantageous under some circumstances) to enable high dose rates without compromising temperature control and thus minimize the irradiation time. This is advantageous for commercial reasons.

The vacancy concentration can be measured spectroscopically. For example, to measure concentrations of isolated vacancies, spectra are obtained at 77 K, using liquid nitrogen to cool the samples, since at that temperature sharp peaks at 741 nm and 394 nm are seen that are attributable to neutral and negatively charged isolated vacancies respectively. The coefficients that are used for the calculations of concentrations of isolated vacancies in the present specification are those set out by G. Davies in Physica B 273-274 (1999) 15-23, as detailed in Table 1 below. In Table 1, "A" is the integrated absorption (meV cm$^{-1}$) in the zero phonon line of the transition, measured at 77 K, with the absorption coefficient in cm$^{-1}$ and the photon energy in meV. The concentration is in cm$^{-3}$.

TABLE 1

| Defect | Calibration |
|---|---|
| V$^-$ | $A_{ND1} = (4.8 \pm 0.2) \times 10-16[V^-]$ |
| V$^0$ | $A_{GR1} = (1.2 \pm 0.3) \times 10-16[V^0]$ |

Note that while the above description of irradiation refers to electron irradiation, it is possible to introduce vacancies using neutron irradiation. It is also theoretically possible to create an HPHT diamond tool piece with an aggregated nitrogen centre to C nitrogen centre ratio of greater than 30% without using an irradiation step at all. However, this would require much more time or much higher temperatures to achieve.

Once vacancies have been introduced by irradiation, the irradiated diamond material 12 is annealed. Annealing makes the vacancies more mobile within the diamond crystal lattice, and a vacancy may be replaced by a substitutional nitrogen. As described above, substitutional nitrogen atoms in the crystal may form predominantly A centres, B centres or C centres. As mentioned above, annealing may be done above 800° C. in a vacuum or using an HPHT process. A typical annealing treatment is a two-step process with a first annealing treatment at 800° C. in a vacuum and a second annealing treatment at 1500° C. in a vacuum.

It has been found that diamond material treated as described above such that the aggregated nitrogen centre to C-centre ratio is greater than 30% improves the wear resistance and toughness of the diamond material, making it suitable for use as a tool. A possible reason for the improvement in properties is that the aggregated nitrogen centres reduce lattice strain in the diamond compared to a diamond crystal lattice consisting only of C-centres. It will be appreciated that the both time and temperature of annealing will influence the ratio of aggregated nitrogen centres to C-centres.

The diamond material used in embodiments of the present invention is HPHT diamond. It will be understood that natural diamond, HPHT diamond and Chemical Vapour Deposition (CVD) diamond have their own distinctive structural and functional characteristics and thus the terms "natural", "HPHT" and "CVD" not only refer to the method of formation of the diamond material but also refer to specific structural and functional characteristics of the materials themselves. For example, a synthetic CVD diamond material may be unequivocally distinguished from a synthetic diamond material synthesized using HPHT techniques by the dislocation structure. In synthetic CVD diamond, dislocations generally thread in a direction that is roughly perpendicular to the initial growth surface of the substrate, i.e. where the substrate is a (001) substrate, the dislocations are approximately aligned parallel to the [001] direction. In synthetic diamond material synthesized using HPHT techniques, dislocations that nucleate on surface of the seed crystal (often a surface close to {001}) typically grow in <110> directions. Thus the two types of material can be distinguished by their different dislocation structures observed, for example, in an X-ray topograph.

HPHT diamond material may also be positively distinguished from natural or CVD diamond by detecting the presence of metallic inclusions. Metallic inclusions are incorporated into HPHT diamond as a result of the synthesis process, the metallic inclusions originating from metals used as the solvent catalyst metal, e.g. iron, cobalt, or nickel etc. These inclusions can vary in size, typically from less than 1 μm to more than 100 μm. Larger inclusions within that size range may be observed using a stereo-microscope (e.g. a Zeiss DV4); whilst smaller inclusions within that size range may be observed using transmitted light in a metallurgical microscope (e.g. a Zeiss "Axiophot").

A further method that can be used to provide positive distinction between synthetic diamonds produced by CVD and HPHT methods is photoluminescence spectroscopy (PL). In the case of HPHT-synthesized material, defects containing atoms from the catalyst metals (typically transition metals) used in the synthesis process (e.g. nickel, cobalt, or iron etc.) are frequently present and the detection of such defects by PL positively indicates that the material has been synthesized by an HPHT method.

The tools formed by embodiments of the present invention may be used for a range of applications including cutting, grinding, polishing, drilling and/or wire drawing.

The diamond material in the tool may be configured into a number of possible crystallographic orientations including 2-point, 3-point and 4-point crystals which correspond to {110}, {111} and {100} crystallographic planes respectively. Particularly good results have been obtained for 3-point HPHT Type Ib diamond in a wire drawing tool and 2-point HPHT Type Ib diamond in a cutting tool. Optionally, the working surface of the diamond tool piece is formed by a single sector of diamond material.

In some embodiments, the portion of the HPHT diamond tool piece with the aggregated nitrogen to C centre ratio of greater than 30% has a nitrogen content in the diamond lattice of greater than 300 parts per million (ppm), greater than 350 ppm or greater than 400 ppm. The nitrogen content in some embodiments is no greater than 800 ppm or no greater than 600 ppm. Nitrogen contents from 0 to 500 ppm have been tested and found to give improved wear rate and hardness after the irradiation and annealing steps.

EXAMPLES

Several samples were made, each from a HPHT single crystal. Various irradiation doses and annealing treatments were used, as described below. These were analyzed to determine the concentration of nitrogen, and the percentage of aggregated nitrogen centres. Furthermore, some of the samples were tested for wear resistance and chipping resistance, to determine the effect of the ration of aggregated nitrogen centres to C-centres on the mechanical properties of a tool made from the irradiated and annealed HPHT single crystal.

The examples were all synthesized using an HPHT process at temperatures of between 1300 and 1500° C. and pressures above 5 GPa. It will be appreciated that other HPHT temperature and pressures could be used. In some cases, the synthesis solvent included one or more nitrogen compounds in order to raise the concentration of nitrogen in the as-synthesized HPHT single crystal diamond.

The nitrogen defect concentrations were determined using infrared spectroscopy, fitting peak intensities and using an appropriate proportionality constant, as is well known to the person of skill in the art.

Wear resistance and chipping resistance were measured in a turning test on an Al—SiC metal matrix composite (25% volume fraction of 20 μm particles). The depth of the cut was 150 μm. The cutting speed was 500 m/min and the feed rate was 0.3 mm/rev. The wear resistance was considered to be the inverse of the increase in cutting force per meter of material cut. The chipping resistance was determined from the tools after the test with an optical microscope and is the inverse of the smallest distance between two edge chips. Rather than providing absolute values, the values for wear resistance and chipping resistance are presented as a fraction of normalized values for a single crystal HPHT diamond tool that has undergone no irradiation or annealing.

Note that HPHT single crystal diamonds grown at different orientations were used. Typically, a single crystal diamond with a (100) orientation is used in cutting applications, and a single crystal with a (111) orientation is used in wire die applications.

Table 2 shows that effect of irradiation and annealing regimes on the concentration of A-centres to C-centres for samples with a (111) orientation. A-centres were measured as these are by far the great majority of aggregated nitrogen centres, but note that other aggregated centres such as B-centres may be present. Annealing was either performed in a vacuum better than $10^{-6}$ mbar or in an HPHT process. In some cases the vacuum anneal was performed as a two stage process at two different dwell temperatures.

TABLE 2

| Example | Irradiation | Vacuum anneal | HPHT anneal | Nitrogen defect |
|---|---|---|---|---|
| 1 | — | — | — | 135 ppm 0% A |
| 2 | — | 5 hr 1500° C. | — | 105 ppm 0% A |
| 3 | 4.5 MeV 9 $10^{16}$ e$^-$/cm$^2$ | 2 hr 800° C. | — | 92 ppm 7% A |
| 4 | 4.5 MeV 9 $10^{16}$ e$^-$/cm$^2$ | 5 hr 1500° C. | — | 163 ppm 20% A |
| 5 | 4.5 MeV 9 $10^{16}$ e$^-$/cm$^2$ | 2.5 hr 1500° C. | — | 125 ppm 31% A |
| 6 | 4.5 MeV 9 $10^{16}$ e$^-$/cm$^2$ | 2 hr 900° C. 5 hr 1500° C. | — | 59 ppm 46% A |
| 7 | 4.5 MeV 9 $10^{16}$ e$^-$/cm$^2$ | 2 hr 800° C. 5 hr 1550° C. | — | 131 ppm 46% A |
| 8 | — | — | 2 min 1900° C. 8 GPa | 150 ppm 3% A |
| 9 | — | — | 1 hr 1900° C. 8 GPa | 113 ppm 49% A |
| 10 | 4.5 MeV 9 $10^{16}$ e$^-$/cm$^2$ | — | 2 min 1900° C. 8 GPa | 103 ppm 42% A |
| 11 | 4.5 MeV 9 $10^{16}$ e$^-$/cm$^2$ | — | 1 hr 1900° C. 8 GPa | 170 ppm 9% A |
| 12 | 4.5 MeV 3 $10^{17}$ e$^-$/cm$^2$ | 2 hr 800° C. 5 hr 1500° C. | — | 405 ppm 59% A |

It can be seen that Example 1, with no irradiation or annealing, had a nitrogen concentration of 135 ppm with substantially no A-centres. Example 2, which was annealed but not irradiated, also showed substantially no A-centres. Examples 5, 6 and 7 which were vacuum annealed at two different temperatures, showed a greater proportion of A-centres than example 3 and 4, which were vacuum annealed in a single stage process. The HPHT annealed samples also displayed a high ration of A-centres.

Table 3 shows the effect of irradiation and vacuum annealing on mechanical properties of (100) oriented single crystal HPHT diamonds, measured as normalized values against a comparable sample that had not undergone irradiation or annealing.

TABLE 3

| Ex | Irradiation | Vacuum anneal | Nitrogen defect | Normalised wear resistance | Normalised chipping resistance |
|---|---|---|---|---|---|
| 13 | — | — | 214 ppm 0% A | 1.0 | 1.0 |
| 14 | 4.5 MeV 9 $10^{16}$ e⁻/cm² | 2 hr 800° C. 5 hr 1500° C. | 153 ppm 35% A | 1.3 | |
| 15 | 4.5 MeV 3 $10^{17}$ e⁻/cm² | 2 hr 800° C. 5 hr 1500° C. | 137 ppm 50% A | 1.3 | 1.1 |
| 16 | 4.5 MeV 9 $10^{16}$ e⁻/cm² | 2 hr 800° C. 5 hr 1500° C. | 463 ppm 47% A | 5.3 | 3.7 |
| 17 | 4.5 MeV 9 $10^{16}$ e⁻/cm² | 2 hr 800° C. 5 hr 1500° C. | 461 ppm 46% A | 1.9 | 1.3 |
| 18 | 4.5 MeV 3 $10^{17}$ e⁻/cm² | 2 hr 800° C. 5 hr 1500° C. | 515 ppm 66% A | 2.3 | 2.1 |
| 19 | 4.5 MeV 3 $10^{17}$ e⁻/cm² | 2 hr 800° C. 5 hr 1500° C. | 388 ppm 61% A | 3 | 2.2 |

Wear resistance and chipping resistance are improved by irradiation and subsequent annealing to engineer HPHT single crystal diamond with a high ration of A centres to C centres. It appears that higher nitrogen concentrations also give improved mechanical properties. However, nitrogen contents above around 800 ppm can be difficult to synthesize under normal HPHT conditions.

While this invention has been particularly shown and described with reference to preferred embodiments, it will be understood to those skilled in the art that various changes in form and detail may be made without departing from the scope of the invention as defined by the appendant claims.

The invention claimed is:

1. A high-pressure high-temperature, HPHT, diamond tool piece, wherein at least a portion of the HPHT diamond tool piece comprises an aggregated nitrogen centre to C-nitrogen centre ratio of greater than 30%, the aggregated nitrogen centres comprising A centres and B centres, wherein the portion of the HPHT diamond tool piece comprises a nitrogen content no greater than 800 parts per million.

2. The HPHT diamond tool piece according to claim 1, wherein the portion is at least 40% of the volume of the HPHT diamond tool piece.

3. The HPHT diamond tool piece according to claim 1, wherein the HPHT diamond tool piece is a single crystal HPHT diamond tool piece.

4. The HPHT diamond tool piece according to claim 1, comprising polycrystalline diamond, PCD.

5. The HPHT diamond tool piece according to claim 4, wherein the PCD contains a binder material.

6. The HPHT diamond tool piece according to claim 1, wherein the portion of the HPHT diamond tool piece comprises a nitrogen content greater than 300 parts per million.

7. The HPHT diamond tool piece according to claim 1, wherein the aggregated nitrogen centre to C-nitrogen centre ratio is greater than 40%.

8. The HPHT diamond tool piece according to claim 1, wherein the aggregated nitrogen centre to C-nitrogen centre ratio is greater than 50%.

9. The HPHT diamond tool piece according to claim 1, wherein the HPHT diamond tool piece is selected from one of: a wear part, a dresser, a wire drawing die, a gauge stone, a cutter and an engraving tool.

10. A tool comprising at least one HPHT diamond tool piece according to claim 1.

11. A method of producing a high-pressure high temperature, HPHT, diamond tool piece, the method comprising:
    irradiating an HPHT diamond material to introduce vacancies in the diamond crystal lattice;
    annealing the HPHT diamond material such that at least a portion of the HPHT diamond material comprises an aggregated nitrogen centre to C-nitrogen centre ratio of greater than 30%, the aggregated nitrogen centres comprising A centres and B centres, the portion of the HPHT diamond tool piece comprising a nitrogen content no greater than 800 parts per million; and
    processing the HPHT diamond material to form an HPHT diamond tool piece.

12. The method according to claim 11, wherein the annealing is performed in an inert environment at a temperature of at least 800° C.

13. The method according to claim 11, wherein the annealing is performed using a high-pressure high temperature process at a temperature of at least 1300° C. and a pressure of at least 4.5 GPa.

14. A method of producing an HPHT diamond tool piece according to claim 11, wherein the irradiating is performed before, during, or after the processing.

15. A method of producing an HPHT diamond tool piece according to claim 11, wherein the irradiating comprises irradiating the diamond material to a depth of 1 μm or greater.

16. A method of producing an HPHT diamond tool piece according to claim 11, wherein the irradiating is performed at a temperature of 500° C. or less.

17. A method of producing an HPHT diamond tool piece according to claim 11, further comprising cooling the diamond material during the irradiating.

18. A method of producing an HPHT diamond tool piece according to claim 11, wherein the irradiating comprises irradiating with an energy selected from any of 30 keV or greater; 0.1 MeV to 12 MeV; 0.5 MeV to 10 MeV; and 1 MeV to 8 MeV.

* * * * *